(12) United States Patent
Ramamoorthi et al.

(10) Patent No.: US 8,084,285 B2
(45) Date of Patent: Dec. 27, 2011

(54) FORMING A MICRO ELECTRO MECHANICAL SYSTEM

(75) Inventors: Sriram Ramamoorthi, Corvallis, OR (US); Donald J. Milligan, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/948,477

(22) Filed: Nov. 17, 2010

(65) Prior Publication Data

US 2011/0059566 A1 Mar. 10, 2011

Related U.S. Application Data

(62) Division of application No. 11/584,057, filed on Oct. 20, 2006, now Pat. No. 7,851,876.

(51) Int. Cl.
*H01L 21/00* (2006.01)

(52) U.S. Cl. ............. 438/52; 438/50; 438/51; 438/53; 438/54; 438/55

(58) Field of Classification Search ............. 438/50–55
See application file for complete search history.

(56) References Cited

U.S. PATENT DOCUMENTS

| | | | |
|---|---|---|---|
| 4,773,015 A | 9/1988 | Leland et al. | |
| 5,144,598 A | 9/1992 | Engdahl et al. | |
| 5,747,353 A * | 5/1998 | Bashir et al. | 438/50 |
| 5,865,417 A | 2/1999 | Harris et al. | |
| 6,294,400 B1 * | 9/2001 | Stewart et al. | 438/52 |
| 6,504,385 B2 | 1/2003 | Hartwell et al. | |
| 6,633,256 B2 | 10/2003 | Zhdanov et al. | |
| 6,936,492 B2 | 8/2005 | McNeil et al. | |
| 6,978,673 B2 * | 12/2005 | Johnson et al. | 73/504.12 |
| 7,083,997 B2 * | 8/2006 | Brosnihhan et al. | 438/50 |
| 7,205,174 B2 * | 4/2007 | Hung | 438/52 |
| 7,223,624 B2 | 5/2007 | Wu et al. | |
| 7,354,788 B2 * | 4/2008 | Bar-Sadeh et al. | 438/52 |
| 7,393,714 B2 | 7/2008 | Oguchi | |
| 7,444,873 B2 * | 11/2008 | Robert | 73/514.32 |
| 2002/0020053 A1 | 2/2002 | Fonash et al. | |
| 2004/0246648 A1 | 12/2004 | Katou et al. | |
| 2005/0091843 A1 | 5/2005 | Yu | |
| 2005/0150297 A1 * | 7/2005 | Ayazi et al. | 73/504.16 |
| 2005/0166677 A1 | 8/2005 | Nasiri et al. | |
| 2006/0208326 A1 | 9/2006 | Nasiri et al. | |
| 2006/0223220 A1 | 10/2006 | Bower | |
| 2007/0029629 A1 | 2/2007 | Yazdi | |
| 2007/0059857 A1 | 3/2007 | Sooriakumar et al. | |

FOREIGN PATENT DOCUMENTS

| | | |
|---|---|---|
| WO | 9524658 A1 | 9/1995 |
| WO | 0180286 A2 | 10/2001 |

\* cited by examiner

*Primary Examiner* — Kevin M Picardat
*Assistant Examiner* — Bac Au

(57) ABSTRACT

A method of forming a micro-electro mechanical system (MEMS), includes (1) removing material from a first wafer to define a first movable portion corresponding to an x-y accelerometer and a second movable portion corresponding to a z accelerometer, where each movable portion comprises at least one flexure member and at least one proof mass, each proof mass and flexure member being formed by the selective removal of material from a top side and a bottom side of first wafer; (2) bonding the first wafer to a second wafer comprising an electronic circuit, such that a gap is defined between the first wafer and the second wafer. The thickness of the at least one flexure member of the first movable portion is independent of a thickness of the at least one flexure member of the second movable portion and a thickness of the proof mass of the first movable portion is independent of a thickness of the at least one proof mass of the second movable portion.

20 Claims, 5 Drawing Sheets

FORMING A MICRO ELECTRO MECHANICAL SYSTEM

RELATED APPLICATION

This application is a divisional application and claims the priority under 35 U.S.C. §120 of previous U.S. patent application Ser. No. 11/584,057, now allowed, which was filed Oct. 20, 2006 now U.S. Pat. No. 7,851,876, entitled "Micro Electro Mechanical System," which application is incorporated herein by reference in its entirety.

BACKGROUND

Micro-electro mechanical systems (MEMS) devices are a combination of micro mechanical and micro electronic systems.

Some MEMS devices may include two chips wired together. It can be difficult to achieve the desired alignment between the two chips.

BRIEF DESCRIPTION OF THE DRAWINGS

The accompanying drawings illustrate various embodiments of the present system and method and are a part of the specification. The illustrated embodiments are merely examples of the present system and method and do not limit the scope of the disclosure.

Throughout the drawings, identical reference numbers designate similar, but possibly not identical, elements.

DETAILED DESCRIPTION

The present specification discloses an exemplary system and method for forming a micro-electro mechanical system (MEMS) transducer. According to one exemplary embodiment disclosed herein, the MEMS transducer is formed from two wafers and decouples the thickness of the proof mass and flexures, thereby allowing each to be independently designed. Additionally, the present exemplary system and method etches both sides of the wafer defining the flexures and the proof mass, allowing for optical alignment of the top and bottom wafers. Further details of the present MEMS transducer system and method will be provided below.

Before particular embodiments of the present system and method are disclosed and described, it is to be understood that the present system and method are not limited to the particular process and materials disclosed herein as such may vary to some degree. It is also to be understood that the terminology used herein is used for the purpose of describing particular embodiments and is not intended to be limiting, as the scope of the present system and method will be defined by the appended claims and equivalents thereof.

As used in the present specification and in the appended claims, the term "proof mass" is meant to be understood broadly as including any predetermined inertial mass used in a measuring device or machine, such as in acceleration measurement equipment, which serves as the reference mass for the quantity to be measured.

In the following description, for purposes of explanation, numerous specific details are set forth in order to provide a thorough understanding of the present system and method for forming a micro-electro mechanical system (MEMS) transducer. It will be apparent, however, to one skilled in the art, that the present method may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification may possibly refer to different embodiments.

Exemplary Structure

Figure 1:
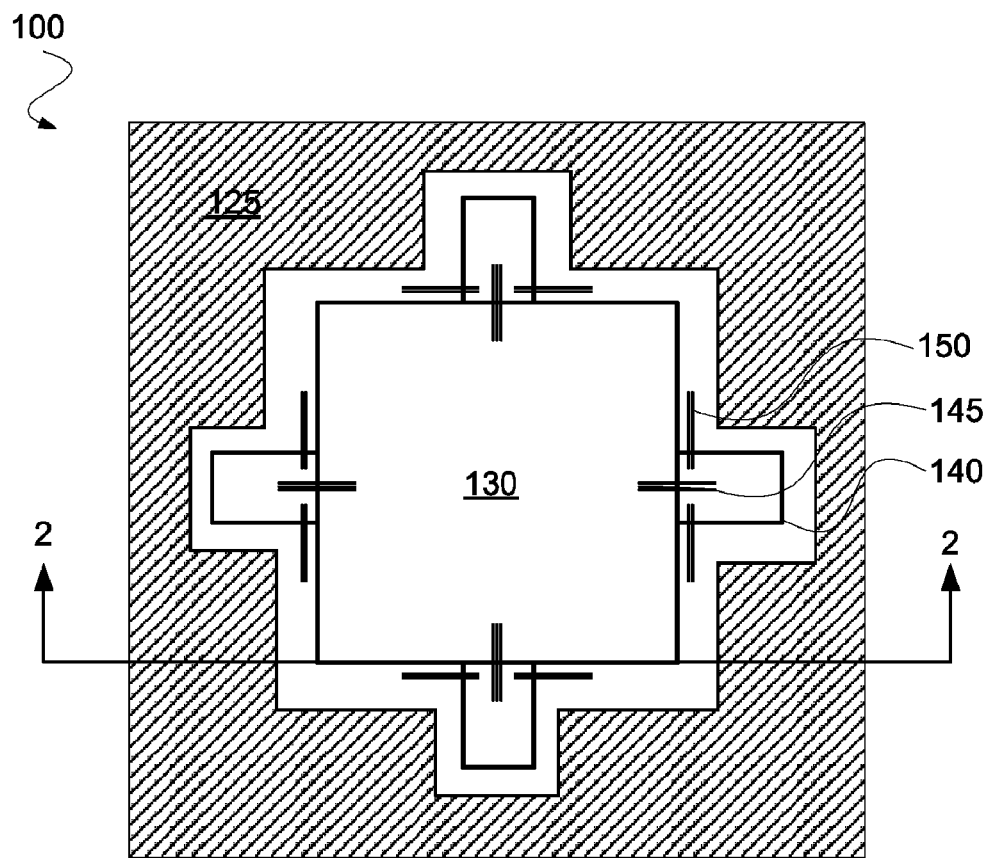
FIG. 1 illustrates a top view of a two layer single chip MEMS device according to one exemplary embodiment.
Figure 2:
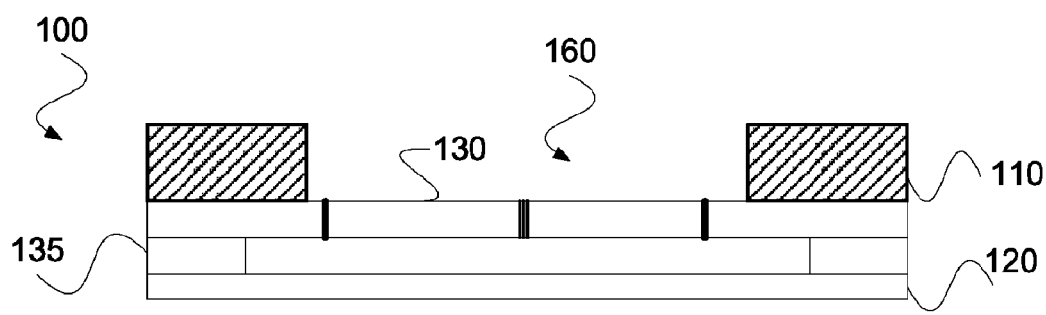
FIG. 2 illustrates a cross sectional view of the MEMS device of FIG. 1 taken along section 2-2 in FIG. 1.

FIGS. 1 and 2 illustrate various views of a MEMS device (100) according to one exemplary embodiment. In particular, FIG. 1 illustrates a top view of the MEMS device (100) while FIG. 2 illustrates a cross sectional view of the MEMS device taken along section 2-2 in FIG. 1. As shown in FIG. 2, the MEMS device generally includes an upper wafer (110) positioned above a lower wafer (120). A material (135) bonds the two wafers (110, 120) together to form a single chip. As will be described in detail below, the illustrated two wafer configuration may provide for increased processing speed and allows for a number of design and manufacturing benefits.

FIG. 1 illustrates a top view of the upper wafer (110) in detail, according to one exemplary embodiment. As illustrated, the upper wafer (110) includes an anchoring portion (125) and a movable portion (130). A plurality of coupling blocks (140) are located about the periphery of the upper wafer (110) such that the coupling blocks (140) are located between the anchoring portion (125) and the movable portion (130). As shown in FIG. 1, gaps are formed between the coupling blocks (140) and the movable portion (130) as well as between the coupling blocks (140) and the anchoring portion (125).

A plurality of first flexures (145) couple the movable portion (130) of the upper wafer (110) to the coupling blocks (140). Further, any other number of flexures such as the illustrated second flexures (150) can couple the coupling blocks (140) to the anchoring portion (125). The illustrated configuration allows the movable portion (130) of the upper wafer (110) to move parallel to both the x-axis and the y-axis.

Turning now to FIG. 2, a cross sectional view of the MEMS device taken along section 2-2 in FIG. 1 is illustrated. As shown, a material (135) is illustrated as being significantly thicker than the wafers for purposes of illustrating all the features of the MEMS device (100). It will be apparent that the thickness of the material (135) and the upper and lower wafers (110, 120) may have proportions other than those shown in FIG. 2. In one exemplary embodiment, the thickness of the material (135) between upper wafer (110) and the bottom wafer (120), which, according to one exemplary embodiment, is approximately equal to the gap between the wafers. According to one exemplary embodiment, the thickness of the material (135) may be approximately 0.1 to 10 microns. Furthermore, the thickness of the upper and lower wafers (110, 120), may be between about 300-725 microns. The fabrication of the MEMS transducer may also create a cavity (160) on the upper surface of the MEMS device (100). This cavity (160) may, according to one exemplary embodiment, be selectively defined during formation of the MEMS transducer. The cavity (160) may exist in a vacuum, according to one exemplary embodiment.

While the above-mentioned MEMS device (100) is described and illustrated as including two coupled wafers, any number of wafers may be used to form a MEMS device, according to the present exemplary system and method. According to one alternative embodiment, a third wafer, which may be manufactured from any number of materials including, but in no way limited to, glass, plastic, silicon, and the like, may be bonded to the back surface of the MEMS device illustrated in FIGS. 1 and 2 to seal the resulting structure. Alternatively, any number of protective unprocessed surfaces may be used to seal the MEMS device. The resulting MEMS device could then be sealed in a package.

Figure 5:
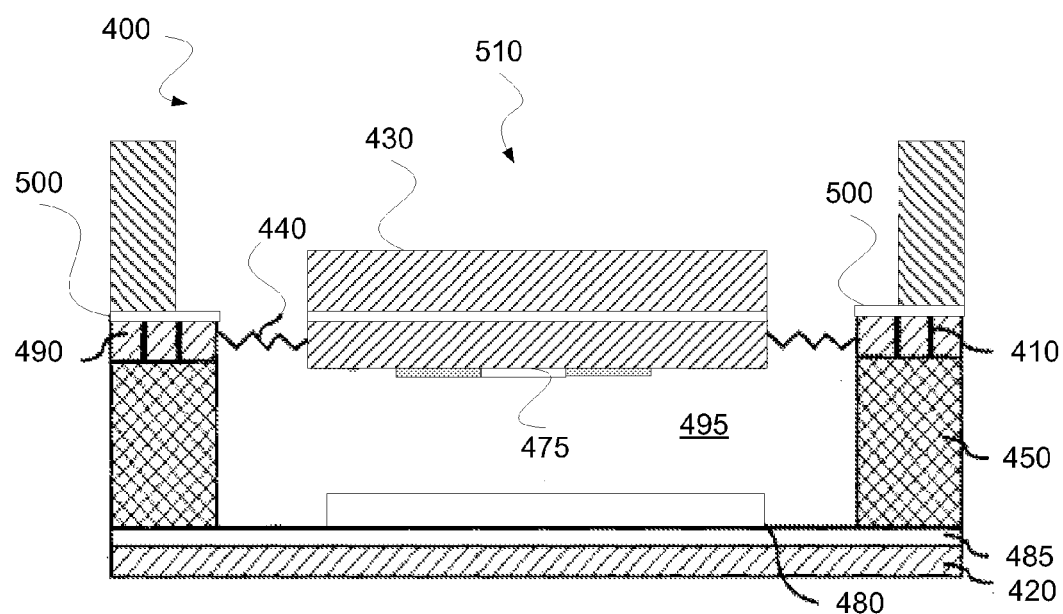
FIG. 5 is a side view of a MEMS device formed from a silicon on insulator wafer, according to one exemplary embodiment.

Additionally, the use and formation of two or more wafers to form the present exemplary MEMS devices allows for the use of alternative wafer structures. Specifically, according to one exemplary embodiment, the upper wafer (410) may be formed from a silicon on insulator (SOI) substrate as illustrated in FIG. 5. Specifically, the ability to form the upper wafer from an SOI substrate provides for greater control of the flexure and cavity formation. As illustrated in FIG. 5, an insulator layer (500) of the SOI substrate can be used as a guide in etching the substrate. Consequently, the thickness of the flexures (440) and the flexure edge can be readily established by the location of the insulator layer (500). Particularly, according to one exemplary embodiment, the height of the resulting flexures (440) is defined by the height of the top silicon on the SOI substrate and height of the proof mass (430) is defined by the height of top silicon and height of the processed handle wafer.

Additionally, as illustrated in FIG. 5, etching the back side of the upper wafer (410) may create a cavity (510) above the proof mass (430). The ability to control the size of the back cavity allows for a design that increases the mass of the proof mass (430) and the volume of the overall MEMS package, which can be used to design for the pressure within a MEMS package. Particularly, according to one exemplary embodiment, the x-y area of the cavity (510) can be extended to be bigger than x-y area of the proof mass (430) which results in higher volume under the proof mass (430) for a given cavity depth and hence assist in controlling the damping of the proof mass. Additionally, according to one exemplary embodiment, the ability to control the back cavity allows for an increased surface area and volume for a getter by connecting the cavity to the external package volume, which can have more surface area, through a deep trench. One exemplary method of forming a MEMS transducer device will now be discussed in further detail below.

Exemplary Formation

Figure 3:
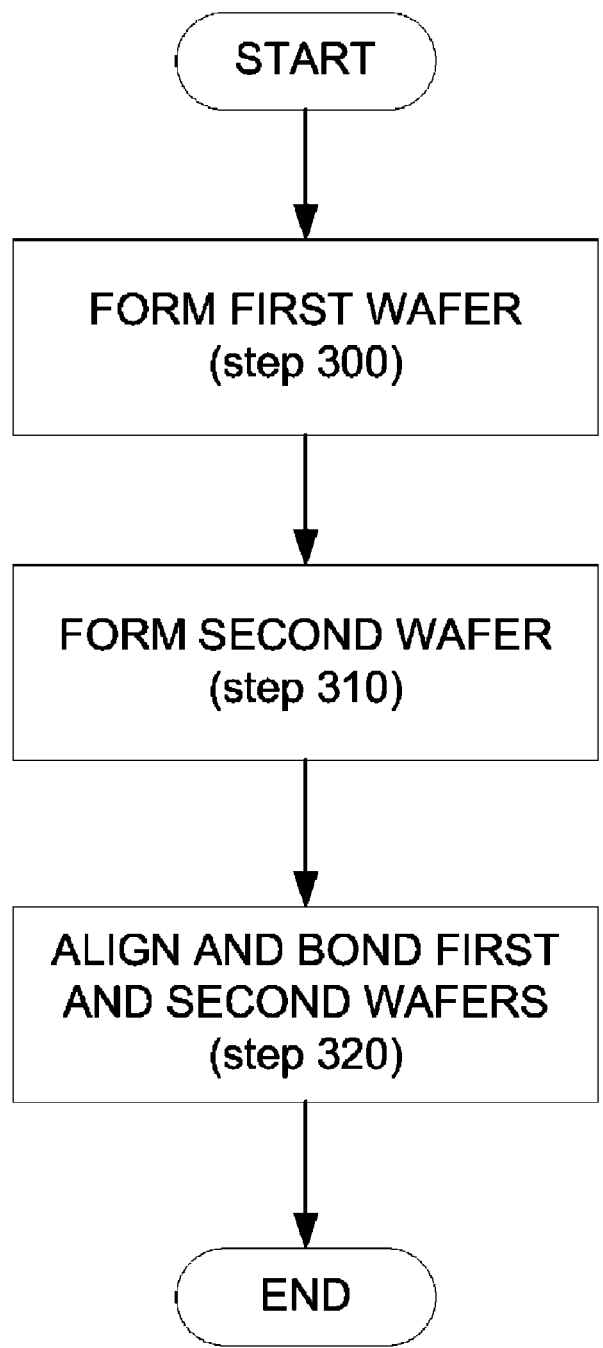
FIG. 3 is a flowchart illustrating a method of forming a MEMS device according to one exemplary embodiment.

FIG. 3 is a flowchart illustrating a method of forming a MEMS transducer device, according to one exemplary embodiment. As illustrated in FIG. 3, the method begins by forming a first wafer (step 300). According to one exemplary embodiment, formation of the first wafer may include patterning a first side of the first wafer to form features therein. Patterning the wafer can include, but is by no means limited to, photolithography, imprint lithography, laser ablation, laser annealing, microcontact printing, inkjet printing, trenching, micromachining and the like.

According to one exemplary embodiment, the features formed by the above-mentioned processes may include the formation of any number of components including, but in no way limited to, flexures and/or one or more movable portion. The relative size of each movable portion corresponds with a proof mass of that movable portion. As used herein, and in the appended claims, the term "proof mass" shall be interpreted broadly to include any predetermined inertial mass in a measuring device or machine, such as in acceleration measurement equipment, which serves as the reference mass for the quantity to be measured. The proof mass of each movable portion may be independently varied by adjusting the thickness and surface area of the proof mass. Varying the thickness can be accomplished by grinding and/or etching the wafer using any of the suitable presently available or future developed methods. Adjusting the surface area can also include, but is not limited to patterning, etching, trenching, or micromachining.

Varying the thickness of the proof mass can be important to proper functionality. For example, it may be desirable to form separate movable portions to separately detect movement relative to the x-y plane and parallel to the z axis. According to such a method, each movable portion may have a predetermined mass. The mass of each movable portion may be different, such that sensitivity to movement in the x-y and the z planes may be independently selected, for a given die area, as desired within the same MEMS transducer device, thus selectively enhancing the sensitivity.

According to the present exemplary embodiment, the formation of the MEMS transducer device using multiple wafers, allows both sides of the wafers to be etched or otherwise modified. For example, according to one exemplary embodiment, the formation of the flexures in the first wafer include defining the flexure by removing material from a first side of the wafer and further removing material from a second side of the wafer to release the flexure. According to one embodiment, the removal of material from the second side may be performed after multiple wafers are bonded, as will be described in further detail below.

The formation of the first wafer further includes the formation of one or more electrically active plates on each of the movable portions. This may be performed using any number of deposition and/or patterning processes including, but not limited to, a vacuum deposition processes, a spin coating processes, a curtain coating processes, an inkjet coating processes, and the like. For example, according to one exemplary embodiment, a second side of the first wafer, which is located opposite of the first side discussed above, may have electrical circuits and/or components formed thereon. These electrically active plates may serve as electrode plates or other electrical components as will be described in more detail below. Further, formation of the movable portion may include the formation of circuitry formed therewith and coupled to the electrode plates and configured to be coupled to other components of the resulting MEMS transducer device. Electrically active plates may be patterned using, but not limited to, any of the previously mentioned methods. The formation of the circuitry can be done using any number of suitable presently available or future developed methods.

As mentioned above, the present exemplary method also includes the formation of a second wafer (step 310). According to one exemplary method, formation of the second wafer includes the formation of a wafer including, but not limited to, electrical components, such as electrodes and/or circuitry. According to one exemplary embodiment, the circuitry formed on the second wafer is configured to be electrically coupled to circuitry in the first wafer through vias (490) and the like. Further, in order to electrically couple the first and second wafers, the present exemplary method includes alignment and coupling of the first and second wafers (step 320). Traditionally, aligning one or more wafers with an identified target generally involves the use of a sophisticated machine, such as an aligner. The alignment process is done such that the electrode plates in the first and second wafer are aligned relative to each other. Before the alignment occurs, a bonding material may be deposited on the surface of the first wafer. This bonding material could be, but is not limited to, an adhesive, or dielectric which provides a hermetic seal to the MEMS device. As used herein, and in the appended claims, the term "adhesive" shall be interpreted broadly as including anything that may be used to join a plurality of substrates including, but in no way limited to, glue, solder, chemical bonding, plasma bonding, eutectic bonding and the like. Once the wafers have been aligned and coupled, the electrode plates on each of the wafers are initially aligned relative to one another. Relative movement of the movable portions of the upper wafer may then be monitored to detect movement in the x-y plane and or parallel to the z-axis, as will now be discussed in more detail.

While the presently formed first and second substrates may be mechanically aligned with an aligner, the present exemplary formation method also provides for optical alignment of the first and second wafers. Specifically, according to one exemplary embodiment, the removal of material from both a first and a second side of the first wafer allows for an optically viewable path through the first wafer. Consequently, physical alignment of the first relative wafer may be optically checked during formation. Once aligned and physically coupled as mentioned above, the MEMS transducer may be used for measurement.

Figure 4A:
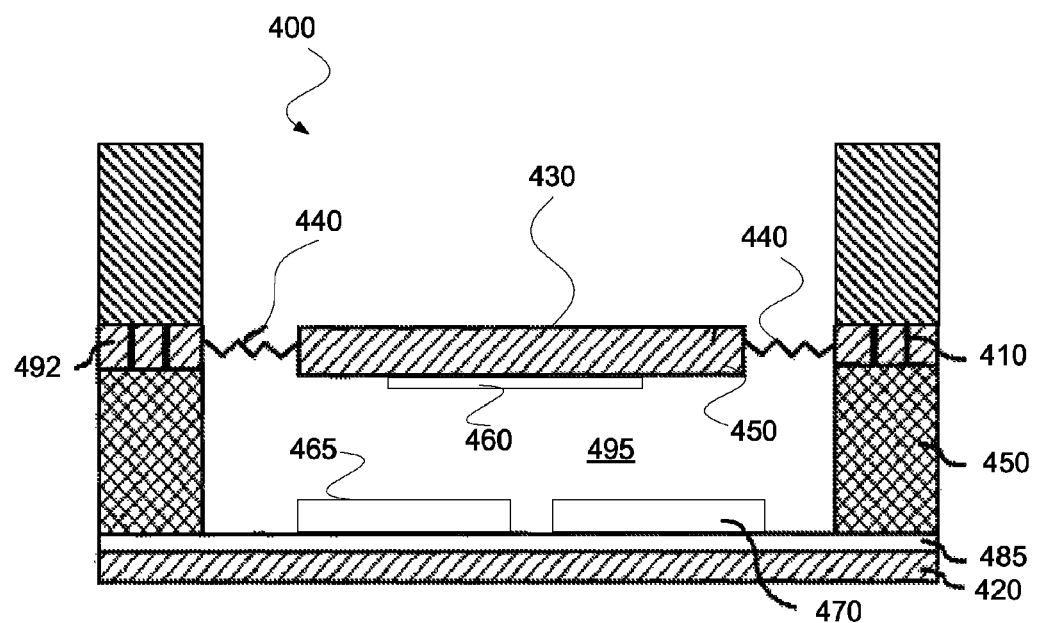
FIG. 4A is a side view of a MEMS device according to one exemplary embodiment
Figure 4B:
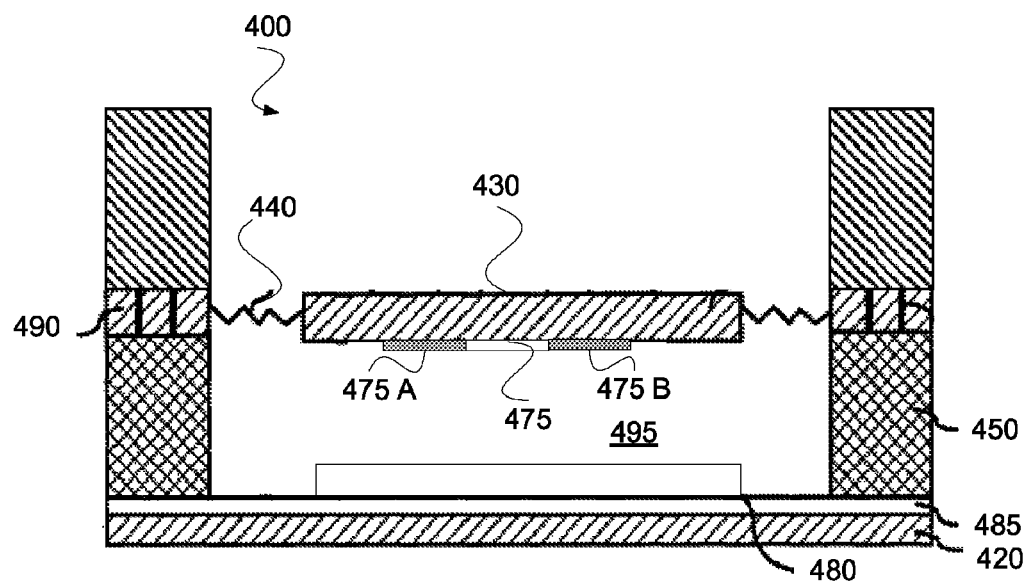
FIG. 4B is a side view of a MEMS device according to one exemplary embodiment.

FIGS. 4A-4B illustrate a cross-section of an exemplary MEMS transducer device (400), according to an embodiment of the present exemplary system and method, which incorporates many of the features of the MEMS device (100) shown in FIGS. 1 and 2. Specifically, FIGS. 4A-4B illustrate the circuitry of the MEMS transducer device (400) in further detail. Referring to FIG. 4A, the MEMS transducer device includes an upper wafer (410) and a lower wafer (420). As mentioned above, the MEMS transducer device (400) is configured to detect movement using capacitor plates, or electrodes, to detect movement of a moveable portion (430) of the upper wafer (410). The flexures (440) allow the moveable portion (430) to move in one or more of the x, y, or z directions in response to an external force, depending on the design of the system. For simplicity and ease of illustration, the flexures (440) are shown schematically and generically. The upper wafer (410) is positioned above the lower wafer (420) and is connected thereto with an adhesive material (450). According to the exemplary illustrated embodiment, the wafers (410, 420) are bonded and sealed to form a single chip.

The present exemplary MEMS transducer device (400) illustrated in FIGS. 4A-4B includes an electrode (460) on a lower surface of the movable portion (430) of the upper wafer (410). Electrodes (465) and (470) are located opposite electrodes on an upper surface of the lower wafer (420). As the movable portion (430) is agitated, the overlap between the electrode (460) on the upper wafer (410) and the electrodes (465) and (470) on the lower wafer (420) varies causing a change in capacitance between the electrodes (460, 465, and 470). Movement of the MEMS transducer device (400) in the x and/or y direction is subsequently detected by detecting the change in capacitance. Detection is provided to the embedded circuitry by the at least one via According to on exemplary embodiment, Equation 1 may be used to calculate a change in capacitance between electrodes, where $\epsilon$ is the dielectric constant:

$$C = (\epsilon A)/d \qquad \text{Equation (1)}$$

In Equation 1, A is the area of overlap between electrodes in the x and y direction and d is the distance between electrodes in the z direction. Use of equation 1 to calculate a change in capacitance between electrodes is described in U.S. Pat. No. 6,504,385, entitled, "Three-Axis Motion Detector" by Hartwell et al, which is hereby incorporated by reference in its entirety.

Movement in the z direction may also be determined using another set of electrodes shown in FIG. 4B. According to one exemplary embodiment, these electrodes are coupled to a second movable portion of the MEMS transducer device. The electrode (475) located on the movable portion (430) and the electrode (480) located on the lower wafer (420), shown in FIG. 4B, are provided for determining movement in the z-direction. According to one exemplary embodiment, the upper electrodes (475) located on the moveable portion (430) may have a short length while the electrode (480) located on the lower wafer (420) may extend the length of the moveable portion (430) such that the overlap between the electrodes (475, 480) does not change. Consequently, any change in capacitance detected between the electrodes (475) and (480) is substantially the result of movement in the z-direction.

Figure 4C:
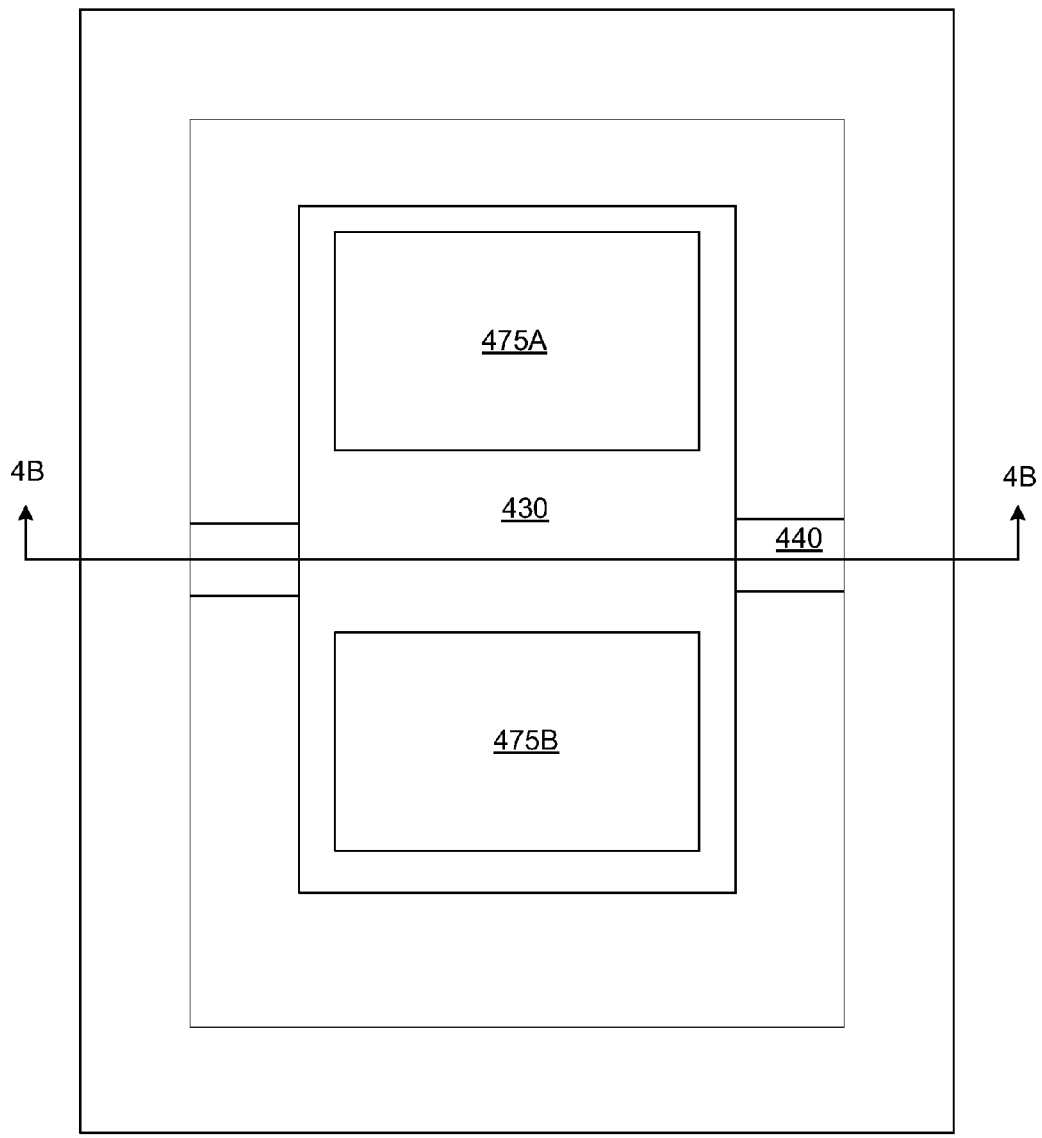
FIG. 4C is a bottom view of a MEMS device, according to one exemplary embodiment.

Particularly, according to one exemplary embodiment illustrated in FIG. 4C, the upper electrode (475) may include a plurality of electrodes (475A, 475B). According to one exemplary embodiment, the z-axis accelerometer of the present exemplary system and method evaluates the differential distance between the two sides (475A, 475B) of the upper electrode (475) relative to the lower electrode (480).

Further, returning again to FIG. 4B, the thickness of the movable portion (430) associated with detection of movement in the z-direction may be formed as desired, substantially independent of the thickness of the movable portion (430) associated with detection of movement in the x-y plane. Consequently the present two-wafer structure allows the moveable portion (430) to have a larger distribution of inertial mass in the x, y, or z directions than conventional single-wafer capacitive MEMS transducers. Furthermore, the x-y sensitivity and z sensitivity of the device may be independently selected and controlled.

The transducer electronics (485) shown in FIGS. 4A-4B may include, but are in no way limited to, one or more circuits detecting the change in capacitance between corresponding electrodes (460, 465, 470, 475, and 480). According to one exemplary embodiment illustrated in FIG. 4B, the electrodes (460, 475) on the moveable portion (430) are connected to the transducer electronics (485) using the vias (490). The signal from the electrodes (460, 475) is passed through the vias (490) to the transducer electronics (485). For example, according to one exemplary embodiment, electrical signals may be transmitted from a circuit (not shown) on the upper wafer (410) to a circuit (not shown) on the lower wafer (420) through vias (490) or vice versa. Moreover conductors (not shown), for example, running along the flexures (440), may be used to connect circuits on the movable portion (430) of the upper wafer (410) to the vias (490). In the various embodiments listed above, one or more circuits and electrodes may be used in alternative embodiments depending on the design of the MEMS device. Furthermore a circuit, as described herein, may include, but is in no way limited to, passive components (e.g., capacitors, resistors, inductors, electrodes, etc.) and active components (e.g., transistors, etc.), or a combination thereof. The electrodes (460, 465, 470, 475 and 480) are illustrated herein as being provided on surfaces of the upper and lower wafer (410 and 420). However, a circuit including active and/or passive components may be provided on any of these surfaces. In addition, a circuit may include components on more than one wafer.

The transducer electronics (485) are also connected to the electrodes (465, 470) on the lower wafer (420), according to one exemplary embodiment. Consequently, the transducer electronics (485) are operable to detect the change in capacitance between the electrodes. The transducer electronics may comprise one or more circuits for calculating the change in overlap A and/or distance d between the electrodes, as used in Equation 1 above. Alternatively, the transducer electronics (485) may output the change in capacitance to an external circuit for calculating the change in overlap A and/or distance d. According to one exemplary embodiment mentioned above, the z-axis accelerometer of the present exemplary system and method evaluates the differential distance between the two sides (475A, 475B) of the electrode. Using Equation 1 above, the distance d may be calculated from the change in capacitance between the electrodes (475, 480). Furthermore, if a value d has been determined, the overlap A may also be calculated from the change in capacitance detected between the electrodes (460, 465, 470) shown in FIG. 4A. While the present exemplary embodiment is directed to a MEMS transducer device, other two-wafer devices may also be used, as will now be discussed in more detail.

According to one exemplary embodiment, more electrodes may be used or the size and shape of the electrodes may be varied for detecting change in capacitance in one or more of the x, y, and z directions. According to one exemplary embodiment, five electrodes and five counter electrodes may be used to detect movement in the x, y, and z directions. Also, a lesser number of electrodes may be used if movement in one or two directions is to be detected. Further, the present exemplary formation method may be used to form similar MEMS devices including, but in no way limited to, gyroscopes, inertial sensors, rate sensors, and the like.

What has been described and illustrated herein are embodiments of the present exemplary systems and methods along with some of variations. The terms, descriptions and figures used herein are set forth by way of illustration and are not meant as limitations. Those skilled in the art will recognize that many variations are possible within the spirit and scope of the present system and method, which is intended to be defined by the following claims—and their equivalents—in which all terms are meant in their broadest reasonable sense unless otherwise indicated.

The preceding description has been presented to illustrate and describe exemplary embodiments. It is not intended to be exhaustive or to limit the disclosure to any precise form disclosed. Many modifications and variations are possible in light of the above teaching. It is intended that the scope of the disclosure be defined by the following claims.

What is claimed is:

1. A method of forming a micro-electro mechanical system (MEMS), comprising:
    removing material from a first wafer to define a first movable portion corresponding to an x-y accelerometer and a second movable portion corresponding to a z accelerometer, wherein each said movable portion comprises at least one flexure member and at least one proof mass, each of said proof mass and said flexure member being formed by the selective removal of material from a top side and a bottom side of said first wafer;
    bonding said first wafer to a second wafer comprising an electronic circuit, such that a gap is defined between said first wafer and said second wafer;
    wherein a thickness of said at least one flexure member of said first movable portion is independent of a thickness of said at least one flexure member of said second movable portion and a thickness of said proof mass of said first movable portion is independent of a thickness of said at least one proof mass of said second movable portion.

2. The method of claim 1, further comprising patterning a circuitry component on a first side of said first wafer.

3. The method of claim 1, wherein removing material from said top and bottom sides of said first wafer comprises at least one of etching, trenching, or micromachining said wafer.

4. The method of claim 1, further comprising forming at least one coupling block on said first wafer, wherein said coupling block is configured to couple at least a segment of a said flexure member to an anchoring portion of said first wafer.

5. The method of claim 1, further comprising sealing said MEMS with a protective unprocessed surface or wafer.

6. The method of claim 1, wherein bonding said first wafer to said second wafer comprises applying an adhesive between said first wafer and said second wafer.

7. The method of claim 1, wherein bonding said first wafer to said second wafer comprises optically aligning said first wafer to said second wafer through a window formed in said first wafer.

8. The method of claim 1, wherein said removing material from said first wafer to define at least one flexure member comprises removing a known amount of material to define a height and a width of said flexure member to generate a desired spring constant of said flexure member.

9. The method of claim 8, wherein said first wafer is configured to allow a said proof mass to translate parallel to said second wafer.

10. The method of claim 8, wherein said first wafer is configured to allow a said proof mass to translate perpendicular relative to said second wafer.

11. The method of claim 1, wherein said first wafer comprises a silicon on insulator (SOI) substrate.

12. The method of claim 1, further comprising:
    defining a cavity within said first wafer, wherein said cavity is defined by subtracting a height of a said proof mass from an original thickness of said first wafer; and
    defining said cavity such that an x-y area of said cavity is larger than an x-y area of that proof mass.

13. A method of forming a micro-electro mechanical system (MEMS), comprising:
    selectively removing material from a first wafer to form a first movable portion corresponding to an x-y accelerometer and a second movable portion corresponding to a z accelerometer, wherein each said movable portion comprises at least one flexure member and a proof mass, each of said proof mass and said flexure member being formed by the selective removal of material from a top side and a bottom side of said first wafer; and
    bonding a second wafer to said first wafer;
    wherein a thickness of said at least one flexure member of said first movable portion is independent of a thickness of said at least one flexure member of said second movable portion and a thickness of said proof mass of said first movable portion is independent of a thickness of said at least one proof mass of said second movable portion.

14. The method of claim 13, further comprising defining a cavity in said top side of said first wafer, wherein said cavity is defined by subtracting a height of a said proof mass from an original thickness of said first wafer.

15. The method of claim 14, further comprising connecting said cavity to an external package volume through a trench.

16. The method of claim 13, further comprising aligning said first and second wafers using a window in said first wafer configured to allow for optical alignment of said first wafer with said second wafer.

17. The method of claim 13, wherein said first wafer comprises a silicon on insulator (SOI) wafer.

18. The method of claim 17, wherein:
a height of said at least one flexure member is defined by a height of a top silicon layer of said SOI wafer; and
a height of said proof mass is defined by a height said top silicon and a height of a processed handle wafer.

19. A method of forming a micro-electro mechanical system (MEMS), comprising:
forming first and second movable portions in a first wafer, wherein each said movable portion comprises at least one electrode, at least one flexure member, and a proof mass, each of said proof mass and said flexure member being formed by the selective removal of material from a top side and a bottom side of said first wafer;
bonding a second wafer to said first wafer, said second wafer comprising at least one electrode corresponding to each said electrode in said first wafer, wherein material is removed from at least a top surface and a bottom surface of said second wafer defining at least one flexure member and at least one proof mass; and
forming at least one circuit operable disposed at least partially within said second wafer and configured to detect lateral movement of said at least one flexure member proof mass of said first movable portion; and
forming at least one circuit disposed at least partially within said second wafer and configured to detect medial movement of said proof mass of said second movable portion;
wherein a thickness of said proof mass of said first movable portion is independent of a thickness of said proof mass of said second movable portion, and a thickness of said at least one flexure member of said first movable portion is independent of a thickness of said at least one flexure member of said second movable portion.

20. The method of claim 19, further comprising:
forming at least one via coupled to said first wafer;
said at least one via providing a path for electrical signals traveling through said first wafer.

* * * * *